United States Patent [19]

Williams

[11] Patent Number: 5,747,891

[45] Date of Patent: May 5, 1998

[54] METHOD OF BLOCKING BIDIRECTIONAL FLOW OF CURRENT

[75] Inventor: Richard K. Williams, Cupertino, Calif.

[73] Assignee: Siliconix incorporated, Santa Clara, Calif.

[21] Appl. No.: 636,367

[22] Filed: Apr. 23, 1996

Related U.S. Application Data

[63] Continuation of Ser. No. 159,900, Nov. 30, 1993, Pat. No. 5,536,977.

[51] Int. Cl.[6] ............................. H01L 29/76
[52] U.S. Cl. .................. 307/87; 257/392; 257/402; 307/43; 307/64
[58] Field of Search .................. 307/43, 64, 65, 307/66, 85, 86, 87, 112, 113, 115, 116, 125, 130, 131; 257/336, 402, 392, 655

[56] References Cited

U.S. PATENT DOCUMENTS

| | | | |
|---|---|---|---|
| 3,508,084 | 4/1970 | Warner, Jr. | 307/304 |
| 4,303,958 | 12/1981 | Allgood | 361/100 |
| 4,315,781 | 2/1982 | Henderson | 148/1.5 |
| 4,477,736 | 10/1984 | Onishi | 327/543 |
| 4,491,750 | 1/1985 | Janutka | 327/436 |
| 4,595,847 | 6/1986 | Weir | 327/382 |
| 4,639,761 | 1/1987 | Singer et al. | 357/234 |
| 4,659,942 | 4/1987 | Volp | 307/19 |
| 4,721,986 | 1/1988 | Kinzer | 357/23.4 |
| 4,961,100 | 10/1990 | Baliga et al. | 357/39 |
| 4,994,886 | 2/1991 | Nadd | 357/41 |
| 5,148,043 | 9/1992 | Hirata et al. | 307/66 |
| 5,260,594 | 11/1993 | Shimizu | 257/368 |
| 5,306,961 | 4/1994 | Leo | 327/530 |
| 5,357,157 | 10/1994 | Throngnumchai | 327/110 |
| 5,362,981 | 11/1994 | Sato et al. | 257/371 |
| 5,420,451 | 5/1995 | Williams et al. | 257/402 |
| 5,451,533 | 9/1995 | Williams et al. | 437/41 |

FOREIGN PATENT DOCUMENTS

| | | |
|---|---|---|
| 0 499 110 | 8/1992 | European Pat. Off. . |
| 59-005659 | 1/1984 | Japan . |
| 61-014760 | 1/1986 | Japan . |
| 61-087374 | 5/1986 | Japan . |
| 4-170815 | 6/1992 | Japan . |

*Primary Examiner*—William M. Shoop, Jr.
*Assistant Examiner*—Jonathan S. Kaplan
*Attorney, Agent, or Firm*—Skjerven, Morrill, MacPherson, Franklin & Friel; David E. Steuber

[57] ABSTRACT

A bidirectional current blocking switch is disclosed. The switch includes a four-terminal MOSFET in which there is no source-body short. The voltages applied to the source and drain terminals are both higher than the voltage applied to the body terminal (for an N-channel) device so that the source-body and drain-body junction of the MOSFET never become forward-biased. The switch of this invention is particularly useful for switching a cascaded set of batteries in a portable computer.

15 Claims, 11 Drawing Sheets

METHOD OF BLOCKING BIDIRECTIONAL FLOW OF CURRENT

This application is a continuation of application Ser. No. 08/159,900, filed Nov. 30, 1993, now U.S. Pat. No. 5,536,977.

CROSS REFERENCE TO RELATED APPLICATIONS

This application is related to application Ser. No. 08/160,560, now U.S. Pat. No. 5,510,747 and application Ser. No. 08/160,539, now U.S. Pat. No. 5,420,451, both of which were filed on the same date as the parent application, and both of which are incorporated herein by reference.

FIELD OF THE INVENTION

This invention relates to a bidirectional current blocking MOSFET and in particular to the use of such a device in a battery disconnect circuit.

BACKGROUND OF THE INVENTION

Users of battery-powered devices such as notebook computers require that the devices be usable for long periods of time between battery recharges. This requirement has led to cascaded battery arrangements, in which a primary battery, a secondary battery, etc., are connected to the device in succession. Frequently an AC/DC converter is also provided to allow the user to conserve battery power when he is near a source of AC power. A connection for an external backup battery may also be provided.

Figure 1:
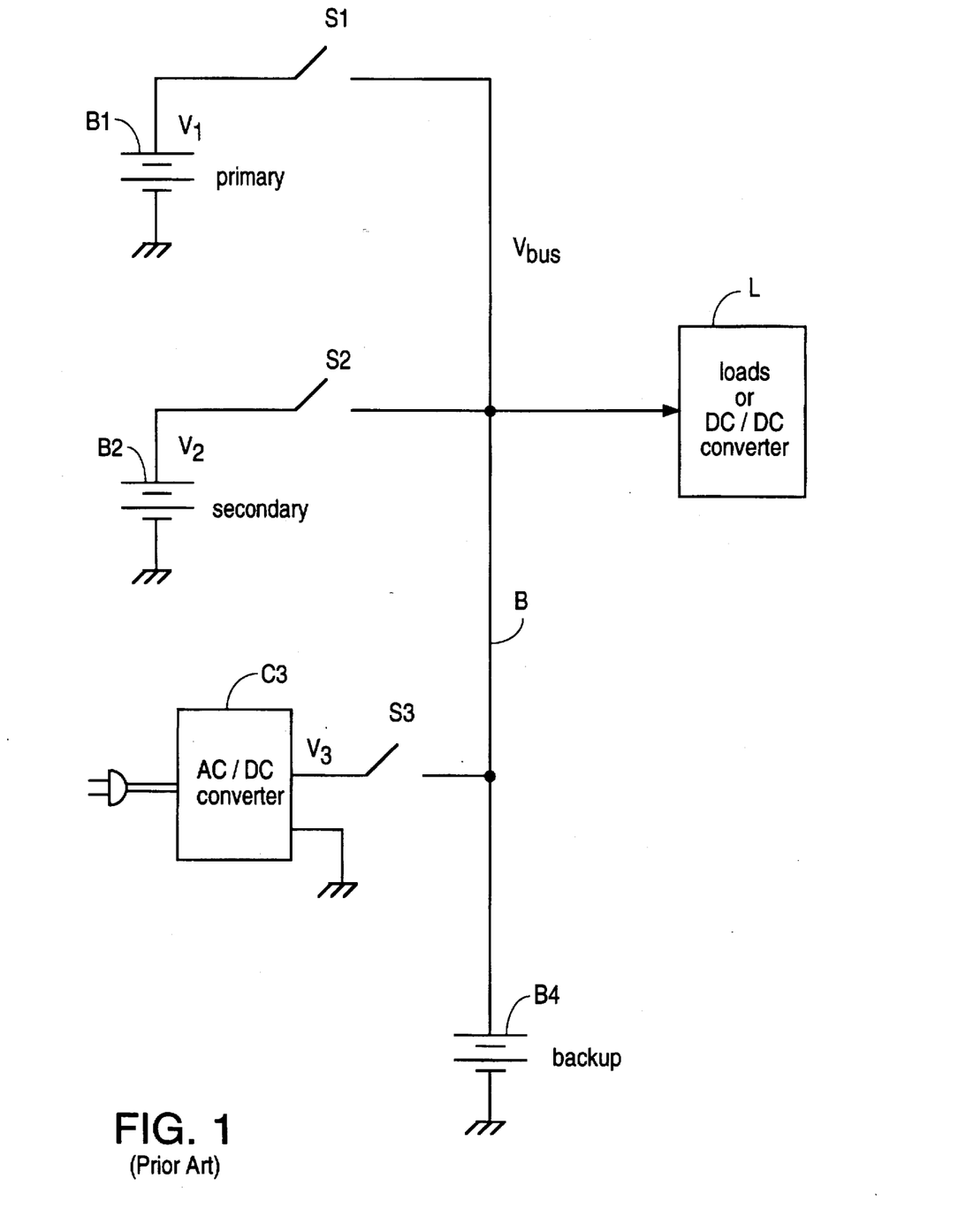
FIG. 1 illustrates a schematic drawing of a multiple source power supply arrangement, including disconnect switches.

Such an arrangement is illustrated in FIG. 1 wherein a primary battery B1 and a secondary battery B2 are connected via switches S1 and S2, respectively, to a load L, which could be a DC/DC converter supplying, for example, a notebook computer. The supply connections are made through a bus which is designated B.

Also connected to bus B is an AC/DC converter C3 which supplies power through a switch S3. The voltage supplied by primary battery B1 is designated $V_1$, the voltage supplied by secondary battery B2 is designated $V_2$, and the voltage supplied by AC/DC converter C3 is designated $V_3$. The voltage at bus B is designated $V_{bus}$. A backup battery B4 is also connected to bus B. Backup battery B4 provides power to some supervisory circuits and memory functions (not shown) when primary battery B1 and secondary battery B2 are discharged. To ensure that it is present when needed, backup battery B4 is not switched.

In the operation of this multiple battery arrangement, only one of switches S1, S2, and S3 would normally be closed at any given time. The remaining switches would be open. When power is supplied by primary battery B1, for example, switch S1 is closed and switches S2 and S3 are open.

Figure 2A:
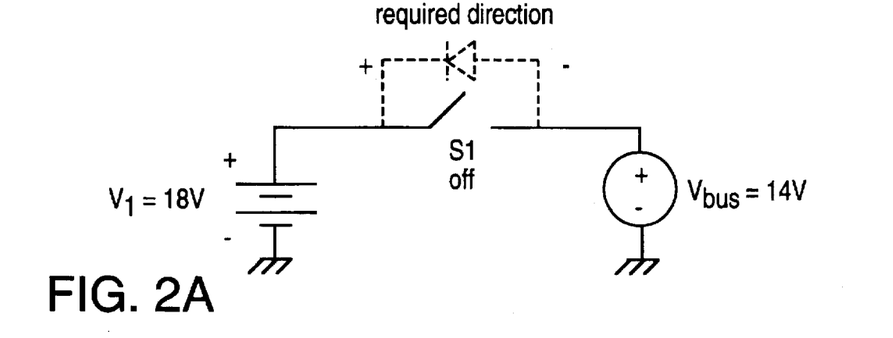
FIGS. 2A, 2B and 2C illustrate possible voltage differences encountered by the disconnect switches shown in FIG. 1.
Figure 2B:
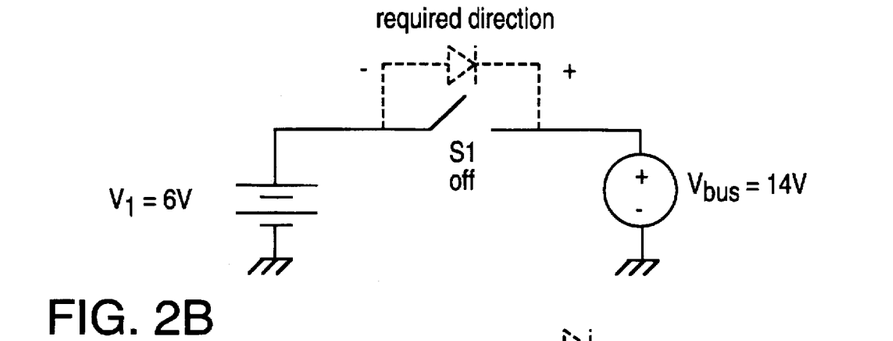
Figure 2C:
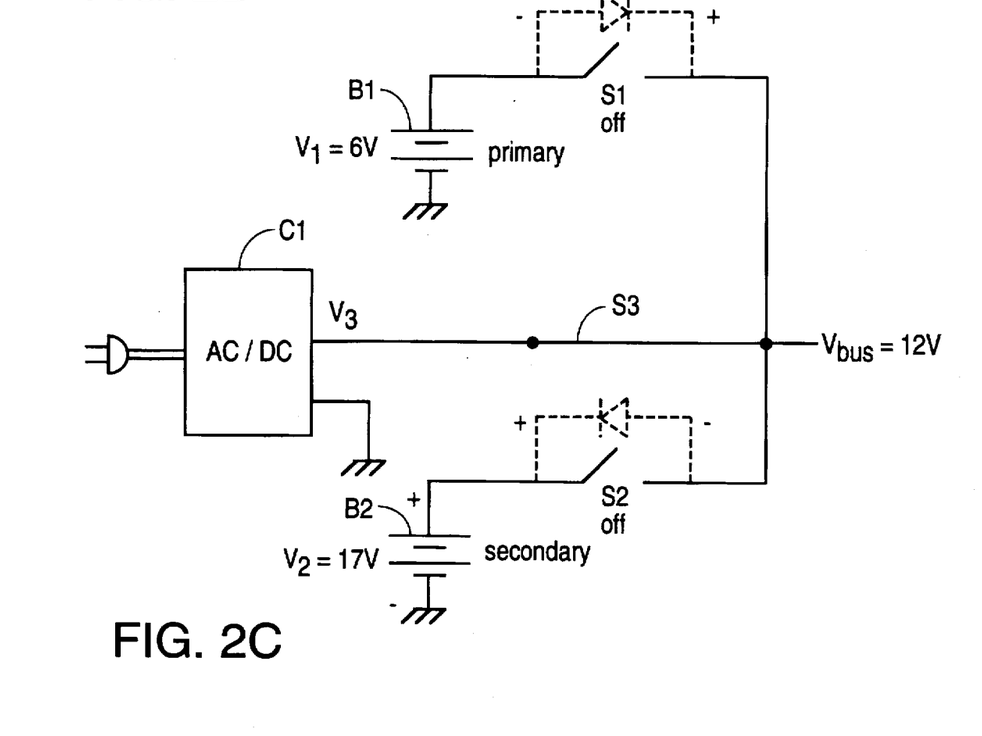

As the power sources are switched in and out, the voltage across switches S1, S2, and S3 can vary both in magnitude and direction. This is illustrated in FIGS. 2A–2C. As shown in FIG. 2A, for example, the output $V_2$ of battery B2 might be 14 V at a given point in time. If battery B2 is then supplying power, the voltage $V_{bus}$ would also equal 14 V. If battery B1 is fully charged, its output voltage $V_1$ might be 18 V. In this case, the left side of switch S1 would be positively charged. On the other hand, assume the same situation except that battery B1 is discharged, so that $V_1$ is 6 V. In this case, the right side of switch S1 is positively charged, as shown in FIG. 2B. A third alternative is illustrated in FIG. 2C where battery B1 is discharged, battery B2 is fully charged, and bus B is supplied by AC/DC converter C1. In the example, $V_1$ is shown as equalling 6 V, $V_2$ is shown as equalling 17 V, and $V_3$ is shown as equalling 12 V. In this case, the right side of switch S1 is positively charged, and the left side of switch S2 is positively charged.

In summary, any of switches S1–S3 may have to withstand a voltage in either direction. The only thing known for certain is that all of the voltages applied to these switches will be above ground.

Figure 3:
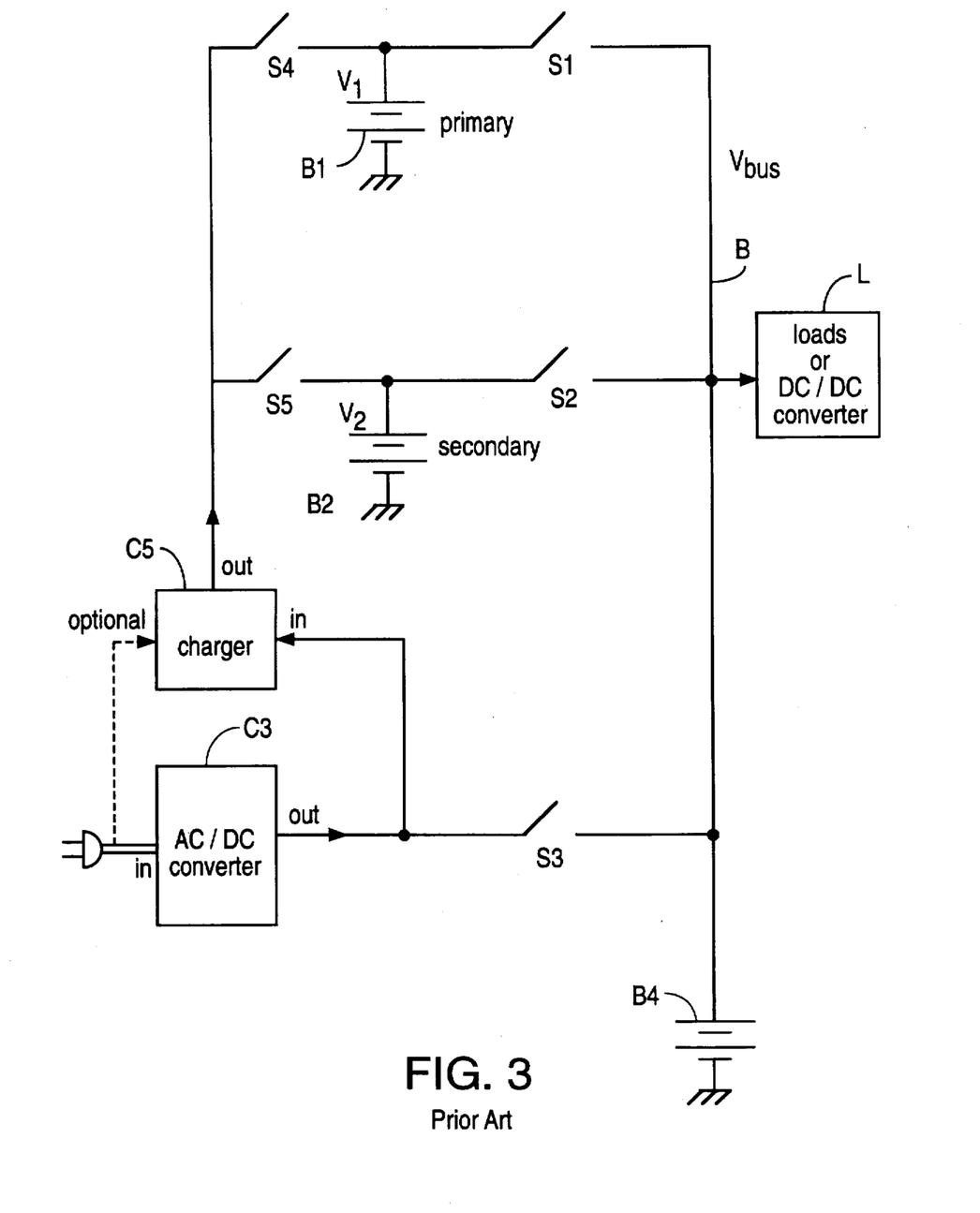
FIG. 3 illustrates a schematic diagram of a multiple source power supply arrangement, including a battery charger.
Figure 4:
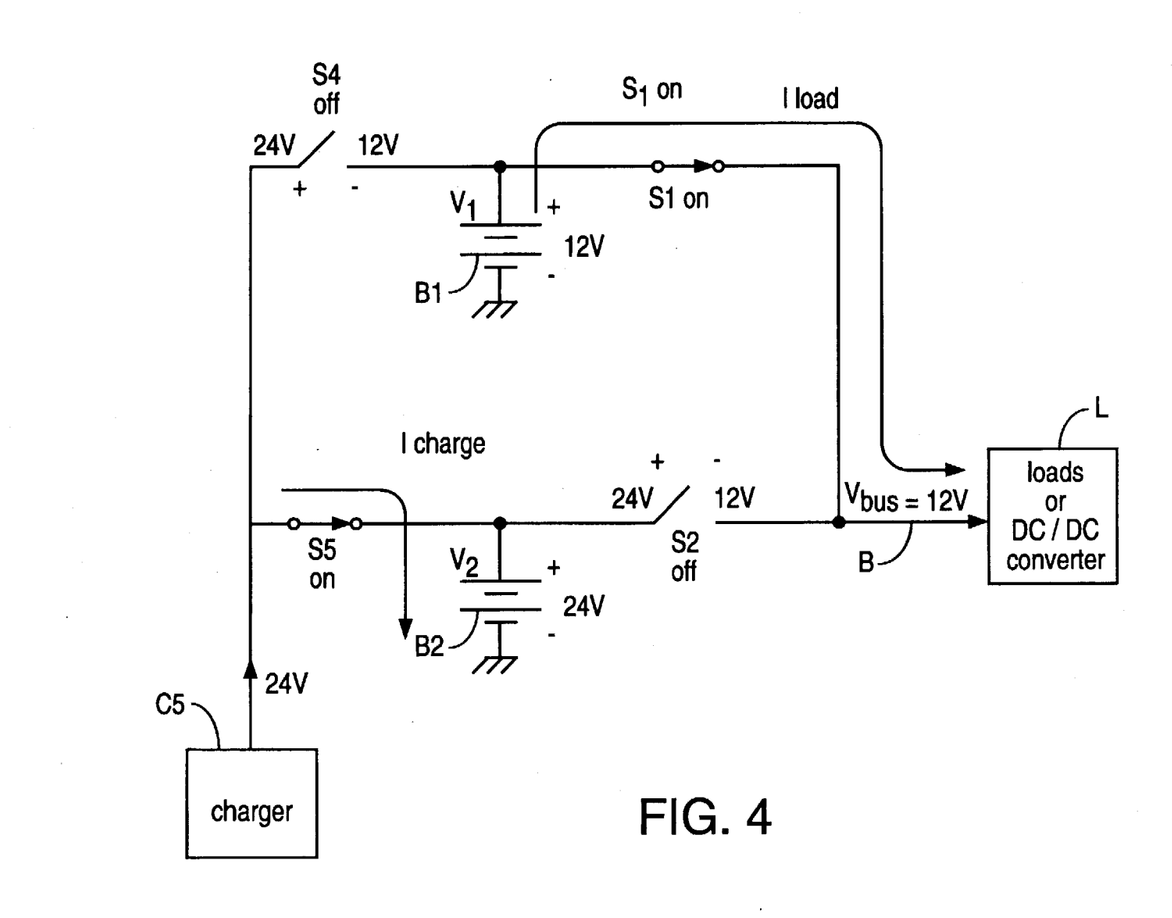
FIG. 4 illustrates possible voltage differences encountered by the disconnect switches shown in FIG. 3.

The device may also be equipped with an internal battery charger, as illustrated in FIG. 3. A battery charger C5 is connected to battery B1 via a switch S4 and to battery B2 via a switch S5. Battery charger C5 may be supplied from the output of AC/DC converter C3 or (optionally) directly from the power main. As illustrated in FIG. 4, battery charger C5 may deliver a voltage as high as 24 V for quick battery charging. In the condition illustrated in FIG. 4, battery B2 is being charged, and the $V_1$ output of battery B1 is equal to 12 volts. Switch S4 therefore must withstand a voltage difference of 12 V. However, since deep discharging of a rechargeable battery is known to extend its life, $V_1$ could drop to below 6 V, in which case switch S4 would need to withstand over 18 V, with its left side being positively charged. On the other hand, when battery charger C5 is not operative it may have a shorted or leaky characteristic, and switches S4 and S5 would then have to block voltages in the other direction. Therefore, switches S4 and S5 must also be bidirectional current blocking.

The foregoing would not represent a problem if switches S1–S5 were mechanical switches. However, it is preferable to use semiconductor technology, and in particular MOSFET technology, in fabricating these switches. Power MOSFETs are typically fabricated with a source-body short to ensure that the intrinsic bipolar transistor (represented by the source, body and drain regions) remains turned off at all times. The prior art teaches generally that a good source-body short is fundamental to reliable parasitic-bipolar-free power MOSFET operation. See, for example, "Power Integrated Circuits", by Paolo Antognetti, McGraw-Hill, 1986, pp. 3.27–3.34.

Figure 5A:
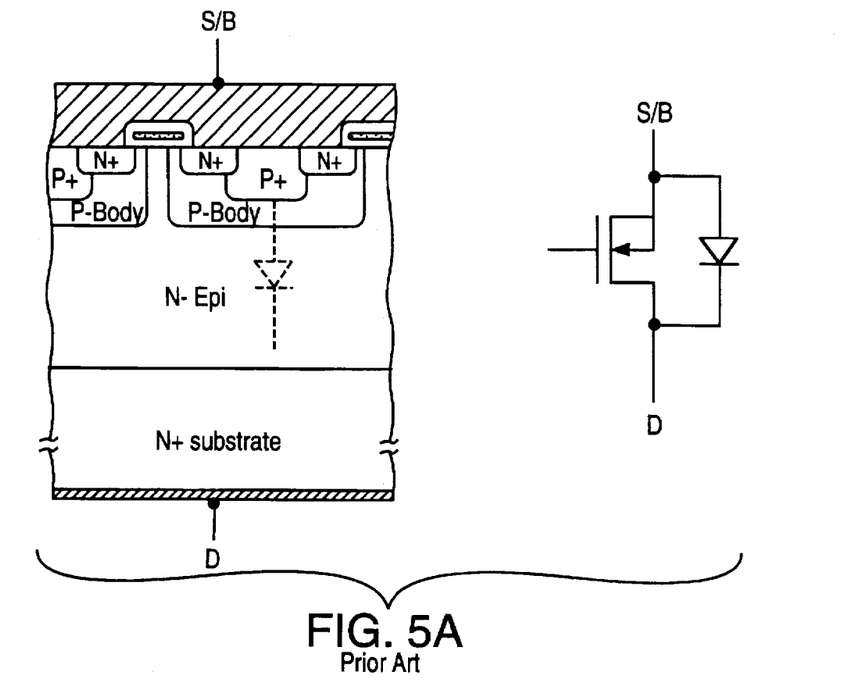
FIGS. 5A–5D illustrate, respectively, a vertical N-channel double-diffused MOSFET (DMOS), a vertical P-channel DMOS MOSFET, a lateral N-channel MOSFET, and a lateral N-channel DMOS MOSFET, all of which contain a source-body short.
Figure 5B:
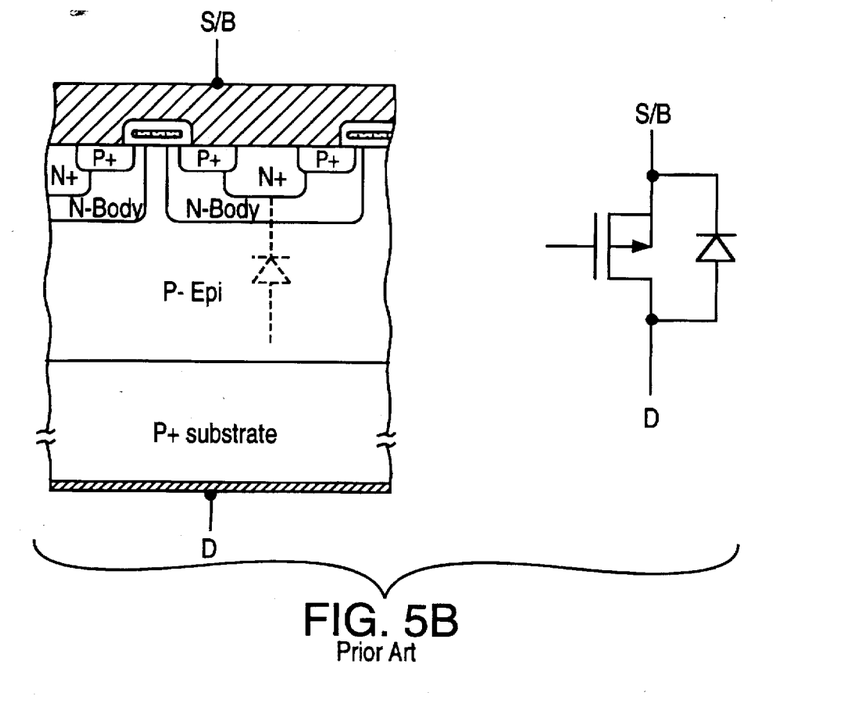
Figure 5C:
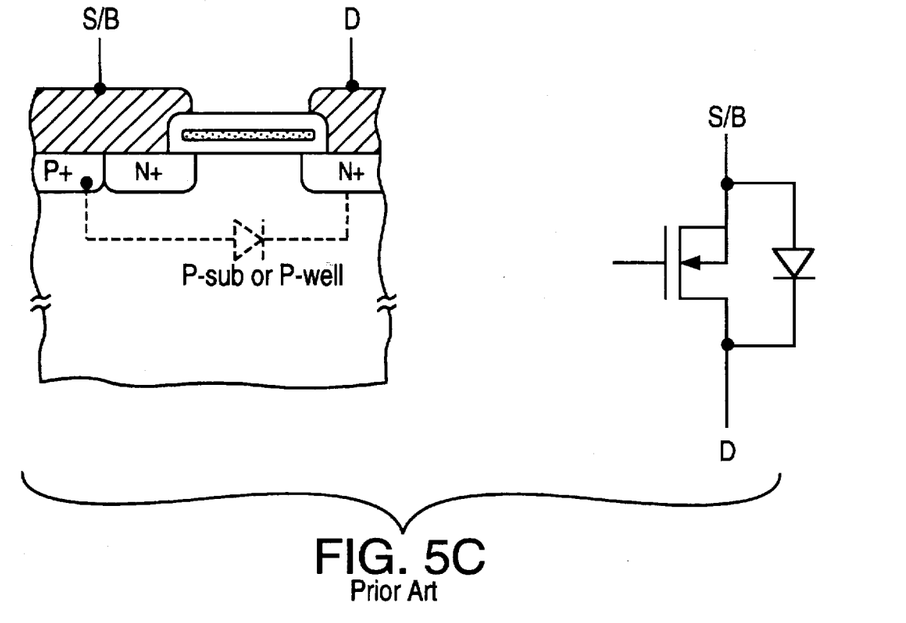
Figure 5D:
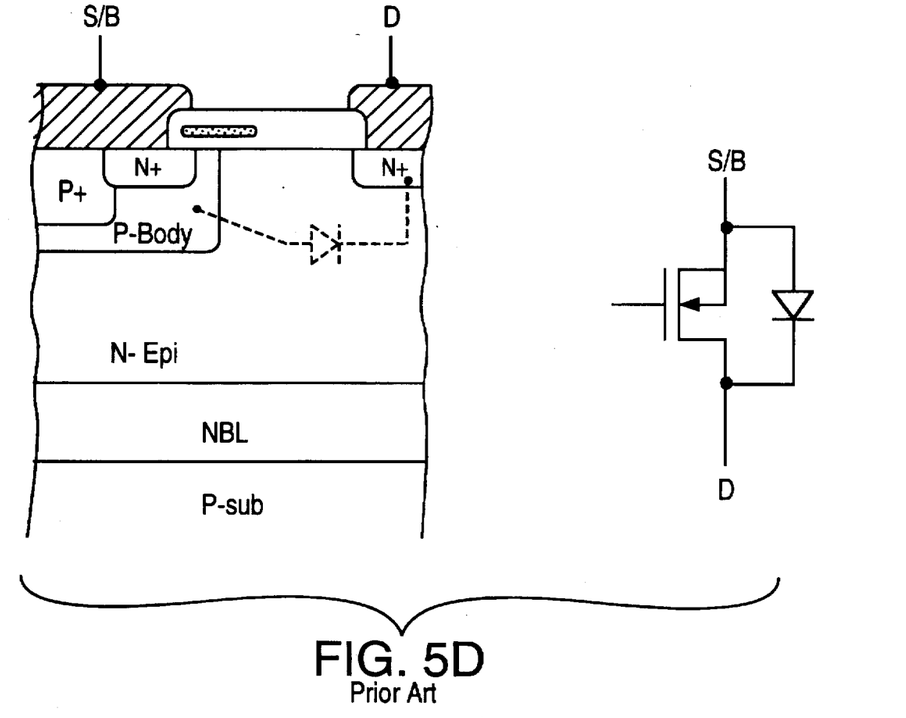

The use of a source-body short has the effect of creating a diode across the drain and body terminals of the MOSFET which is electrically in parallel with the MOSFET. For an N-channel device, the cathode of the diode is connected to the drain; for a P-channel device, the anode of the diode is connected to the drain. Thus, a MOSFET must never be exposed to voltages at its source-body and drain terminals which would cause the "antiparallel" diode to become forward-biased. FIGS. 5A–5D illustrate the polarity of the antiparallel diode (shown in hatched lines) for a vertical N-channel DMOS device (FIG. 5A), a vertical P-channel DMOS device (FIG. 5B), a lateral N-channel device (FIG. 5C), and a lateral N-channel DMOS device (FIG. 5D).

Accordingly, conventional MOSFETs are not suitable for switches S1–S5 because they are not capable of blocking bidirectional currents. In FIGS. 2A–2C, for example, the antiparallel diodes across switches S1 and S2 are shown in hatched lines, with their anode and cathode terminals arranged so as would be required to block the flow of current through the switches. If the polarity of the voltages across the switches were reversed, the antiparallel diodes would become forward-biased.

Figure 6A:
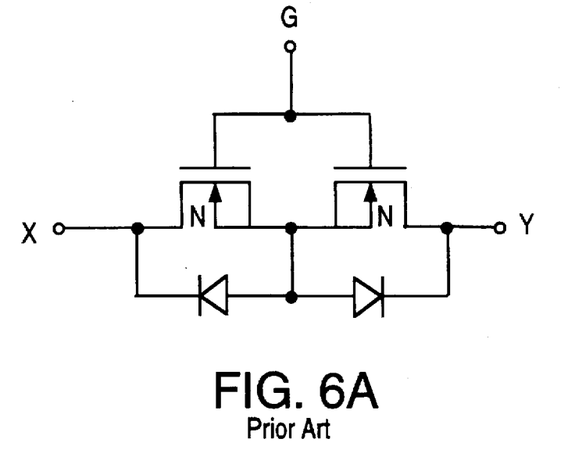
FIGS. 6A–6C illustrate bidirectional current blocking switches consisting of back-to-back MOSFETs.
Figure 6B:
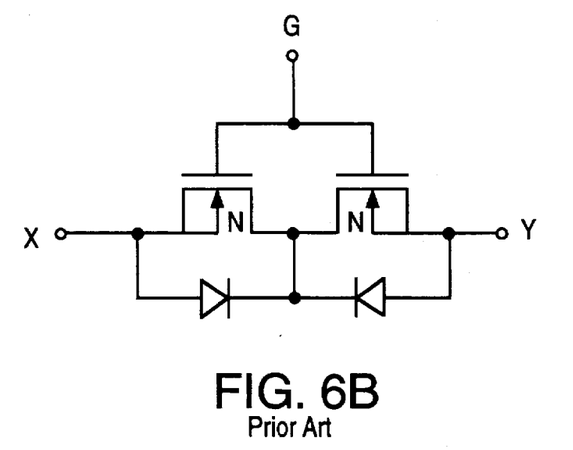
Figure 6C:
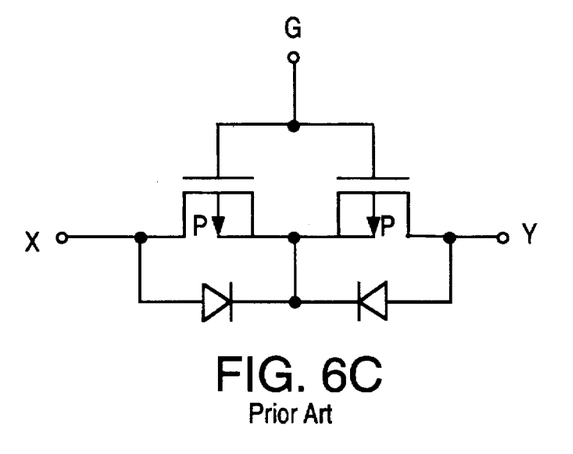

One possible solution to this problem would be to connect two MOSFETs in a back-to-back arrangement, as illustrated schematically in FIGS. 6A–6C. FIG. 6A illustrates a pair of NMOS devices having a common source, FIG. 6B illustrates

3 a pair of NMOS devices having a common drain, and FIG. 6C illustrates a pair of PMOS devices having a common source. These back-to-back arrangements double the on-resistance of the switches, however, and therefore detract significantly from the amount of power delivered to the computer or other device.

Accordingly, what is needed is a bidirectional current blocking semiconductor switch which has the on-resistance of a normal MOSFET and yet does not contain an antiparallel diode across its drain and body terminals.

SUMMARY OF THE INVENTION

In a bidirectional current blocking switch in accordance with this invention, a power MOSFET includes a source region, a body region, a drain region and a gate, each of which is connected to a terminal. The source and body regions are not shorted together, and voltages that are applied to the source and drain terminals are both either higher than (for an N-channel device) or lower than (for a P-channel device) a voltage at which the body region is maintained. The source, body and drain voltages are established such that the source-body and drain-body junctions of the device are never forward-biased.

In a preferred embodiment, the device is a four-terminal N-channel MOSFET, the body region is grounded, and the voltages at the source and drain terminals are never allowed to fall below ground. Thus, the junctions between the P-type body region and the N-type source and drain regions never become forward biased. Provided that the gate voltage transitions which turn the device on and off are fast and the load is relatively capacitive or resistive (but not inductive), the parasitic bipolar transistor represented by the source, body and drain regions will not be activated.

Moreover, the on-resistance of a device according to this invention is dramatically lower than either an N-channel DMOS AC switch or a P-channel DMOS AC switch (frequently referred to as a bilateral switch).

A bidirectional blocking switch according to this invention is capable of conducting current in either direction and is capable of blocking current whether the source is more positive than the drain or the drain is more positive than the source. Moreover, the switch of this invention is capable of inhibiting current between two voltages provided by two different power sources. Neither the source terminal nor the drain terminal need be tied to a fixed or regulated voltage. When the switch is turned on, it quickly pulls the voltage on each side to approximately the same level. (In this specification, the terms "source" and "drain" are frequently used to denote the terminals of the MOSFET even though either terminal may be more positive than the other.)

4

DESCRIPTION OF THE INVENTION

Figure 7:
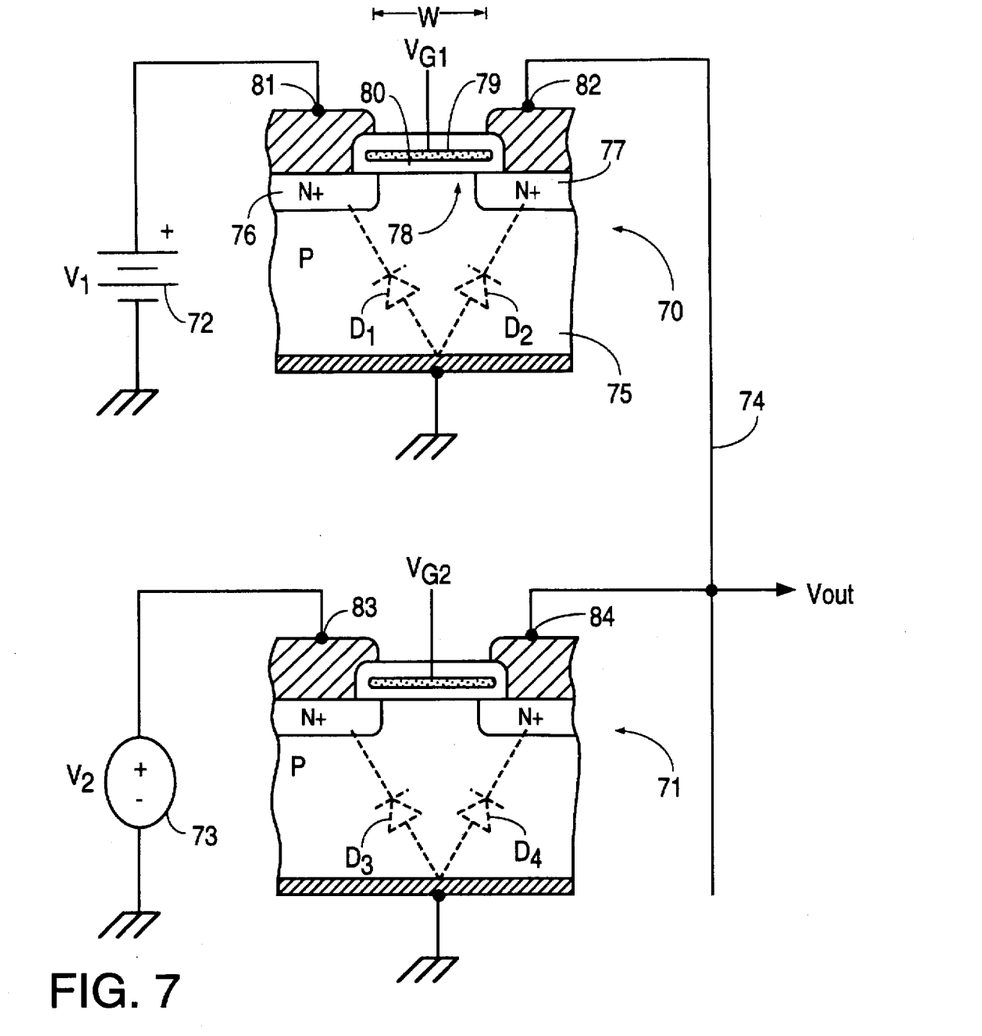
FIG. 7 illustrates a multiple source power supply arrangement containing disconnect switches in accordance with the invention.

FIG. 7 illustrates a multiple source power supply arrangement containing bidirectional current blocking switches 70 and 71 in accordance with the invention. Switch 70 is connected to a battery 72, which supplies a voltage $V_1$, and switch 71 is connected to an AC/DC converter 73 or another battery, which supplies a voltage $V_2$. Switches 70 and 71 connect into a bus 74, which supplies an output voltage $V_{out}$ to a load. While two power sources and two switches are illustrated in FIG. 7, it will be apparent that any number of batteries or other power sources could be included in the arrangement.

Switch 70 is a lateral MOSFET which is illustrated in cross section. MOSFET 70 is preferably formed in either a stripe or cellular pattern in a substrate 75, which in this embodiment is formed of P-type semiconductor material. N+ regions 76 and 77 are formed at the surface of P substrate 75, separated by a channel region 78. A gate 79 is formed over channel region 78, separated from channel region 78 by an oxide layer 80. A terminal 81 connects N+ region 76 to battery 72 and a terminal 82 connects N+ region 77 to bus 74. Gate 79 is supplied by a gate voltage $V_{G1}$. It will be noted that switch 70 is a symmetrical device, and regions 76 and 77 are not referred to as source or drain regions, since either of them can be biased positively or negatively relative to each other.

The junction between P substrate 75 and N+ region 76 is represented by a diode $D_1$, and the junction between P substrate 75 and N+ region 77 is represented by a diode $D_2$.

In a conventional manner, the gate voltage $V_{G1}$ is held low when switch 70 is turned off, and is raised to a positive voltage when switch 70 is turned on. Since P substrate 75 is grounded, and since the voltage at terminals 81 and 82 can only be positive, it is apparent that one of diodes $D_1$ and $D_2$ is always reverse-biased when switch 70 is turned off. Accordingly, when switch 70 is off it blocks current whether the voltage at terminal 81 is higher or lower than the voltage at terminal 82.

Neither N+ region 76 nor N+ region 77 is shorted to P substrate 75. Despite the lack of a source-body short, the NPN transistor represented by N+ regions 76 and 77 and P substrate 75 will not become activated, provided that the on-off transitions at gate 79 are fast relative to the reaction time (capacitance) of the load. Since this circuit acts like a follower, i.e., a common drain configuration relative to the most positive side, an on-state bipolar transistor immediately develops a reverse-biased source voltage which keeps the bipolar transistor turned off. In other words, at the onset of conduction, the formation of the channel in the MOSFET causes the voltage on both sides of the MOSFET to normalize to approximately the same voltage. Presuming that the more negative potential is from a discharged battery or load and the more positive potential is from a power source or fully-charged battery, the more negative potential will rise to a voltage near the positive value when the switch is activated. At the outset of conduction, even if the more negative terminal is at zero volts, the beginning of conduction will immediately raise the more negative potential to a voltage above ground, thereby reverse-biasing the junction. The gate should be driven rapidly to minimize the duration of the switching transition. The fact that neither N+ terminal (i.e., source or drain) is permanently tied to ground is a distinguishing feature of the bidirectional blocking switch. Another distinguishing characteristic is its possible connection to voltage sources of limited energy, such as batteries, where voltage decays with time. The bidirectional blocking switch is therefore not a "high side" switch (permanently tied to a fixed positive supply rail, present whenever circuit operation is desired), since batteries and even AC adapters may discharge or be unplugged. Likewise, it is not a "low side" switch because neither side is tied permanently to ground. Instead, it acts like a reversible source follower when conducting, with the more positive voltage acting as the drain and the more negative voltage as the source.

Switch 71 is identical to switch 70 but has terminals designated 83 and 84 and is controlled by a gate voltage $V_{G2}$. Thus, whatever the voltages applied to terminals 81–84, switches 70 and 71 will block currents whenever their respective gate voltages $V_{G1}$ and $VG_2$ are low, provided that the voltage differences across the switch remain below the breakdown voltage of the internal diodes. The breakdown voltages of the internal diodes would normally be in the range of 8 V to 12 V to 14 V. Switches 70 and 71 can therefore be controlled to selectively connect or isolate battery 72 and AC/DC converter 73 without concern that an antiparallel diode in the switches will become forward-biased. Switches of this invention can be used for any of switches S1–S5 shown in FIGS. 1 and 4.

An arrangement for driving the gate voltages $V_{G1}$ and $V_{G2}$ to a level necessary to turn switches 70 and 71 on is described in the above-referenced application Ser. No. 08/160,560, which is now U.S. Pat. No. 5,510,747, issued Apr. 23, 1996, incorporated herein in its entirety.

It should be noted that, while switches 70 and 71 appear in cross section to be conventional lateral N-channel MOSFETS, each of them has a large gate width W in order to achieve a low on-resistance, typically below 200 mΩ and as low as 60 mΩ. Moreover, in the operation of a conventional MOSFET, it is not common to subject both the source and drain terminals to voltages originating from more than one power source, nor is it common to operate a conventional MOSFET as a bi-directional source follower, i.e., without specifying which terminal acts as the higher (drain) terminal (in an NMOS device) which supplies current and which terminal acts as the lower (source) terminal, which sinks current to ground through a load. Conventional source followers, for example, have one terminal connected directly or indirectly to a power supply or a bus while the other terminal is always the output of the follower. In other words, there is a permanent directional relationship between the battery (or bus) voltage, the drain voltage, and the source voltage (in ascending order). This relationship is not valid in a disconnect switch since either side may be higher at any given time. Similarly, switches 70 and 71 are unlike an N-channel transmission gate in logic arrays (referred to as pass-transistor logic), since in such logic arrays only one supply is present.

Figure 8:
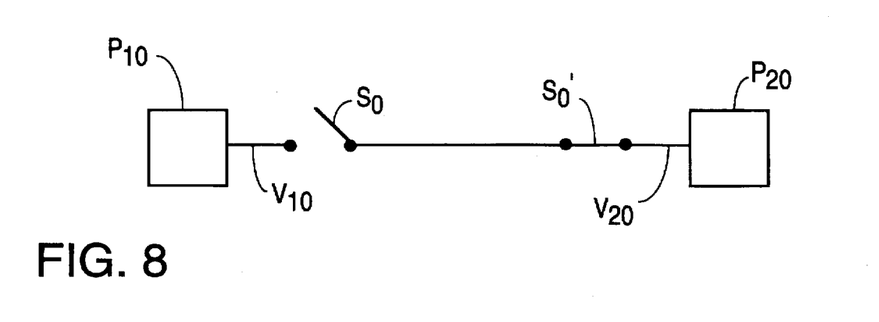
FIG. 8 illustrates schematically the general case of a switch according to this invention.

FIG. 8 illustrates schematically the general case of a switch $S_0'$ according to this invention connected between power sources $P_{10}$ and $P_{20}$. Power sources $P_{10}$ and $P_{20}$ generate voltages $V_{10}$ and $V_{20}$. Switch $S_0$ will block current whether $V_{10} > V_{20}$ or $V_{20} > V_{10}$, and will conduct current from $P_{10}$ to $P_{20}$ or from $P_{20}$ to $P_{10}$. Source $P_{20}$ may be disconnected entirely from the circuit via a second switch $S_0'$.

Figure 9:
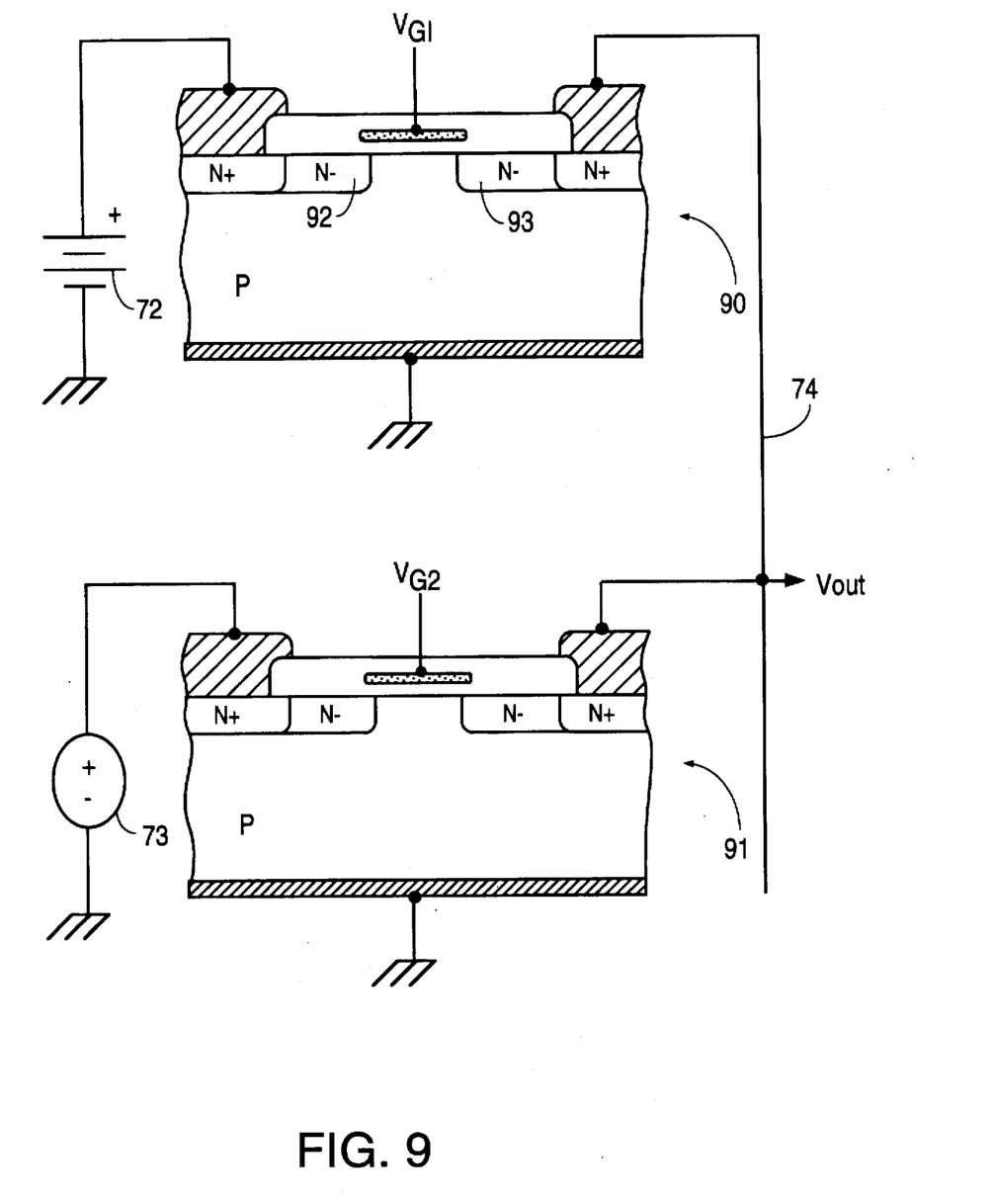
FIG. 9 illustrates a multiple source power supply arrangement with disconnect switches consisting of drifted MOSFETs which are capable of switching higher voltage differences.

FIG. 9 illustrates a drifted version of switches 70 and 71, which is capable of withstanding higher voltage differences (for example, 15 V, 18 V or 24 V). A switch 90 contains N-drift regions 92 and 93, which serve to limit the strength of the electric field across oxide region 94. Drift regions are described more fully in U.S. Pat. No. 5,237,193, to Williams, issued Aug. 17, 1993, which is incorporated herein by reference. Since the gate must be biased sufficiently positive relative to ground to allow the device to conduct over the specified operating range, the oxide separating the gate from the channel region must be thick enough to accommodate the maximum gate voltage reliably. Since either side of switch 90 may serve as the "drain" in a given situation, a drift region must be provided on both sides of the channel region.

The drifted embodiment illustrated in FIG. 9 is useful if the voltage across the switch is above about 14 V. In such situations the drift region prevents the gate oxide from exposure to high electric fields.

To turn the switch on, the gate voltage of switch 90 may either be fixed or may be a voltage slightly higher than $V_1$. If the gate voltage is a fixed value relative to ground (for example, 30 V) a standard gate oxide thickness (200–400 Å) will not support the gate-to-substrate bias at the moment of turn on, and a thicker gate (for example, over 700 Å) must be used. If the gate potential is limited to 10 V above the more negative terminal voltage and rises with that voltage, then the thicker oxide is not needed.

Figure 10A:
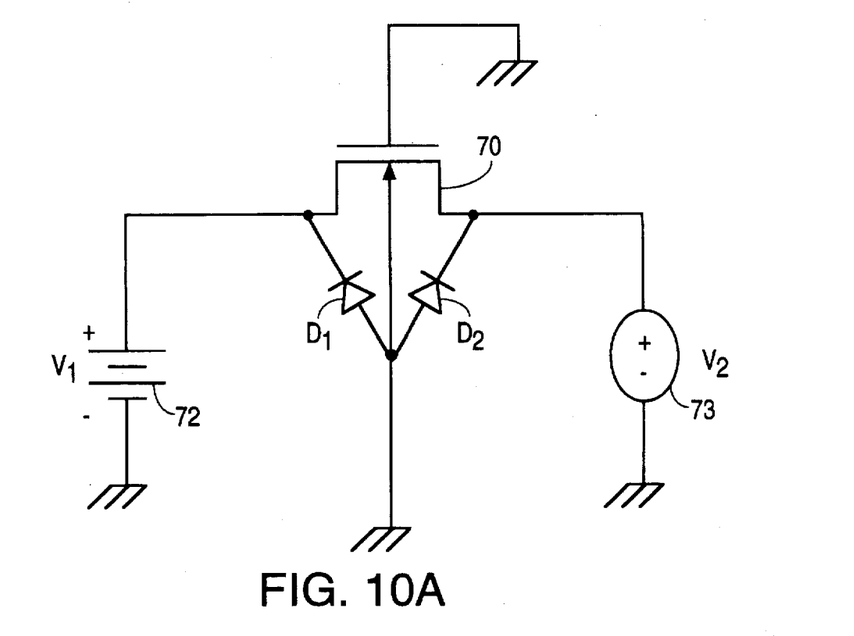
FIGS. 10A and 10B illustrate schematically the off-state and the on-state, respectively, of the switches illustrated in FIGS. 7 and 8.

FIGS. 10A and 10B illustrate an example of the two states of switch 70 shown in FIG. 7. In FIG. 10A, the gate of switch 70 is grounded and switch 70 is turned off, isolating battery 72 from AC/DC converter 73. This would be the situation, for example, when AC/DC converter is supplying the load. Assuming that $V_2$ is greater than $V_1$, diode $D_2$ blocks current from flowing through switch 70.

Figure 10B:
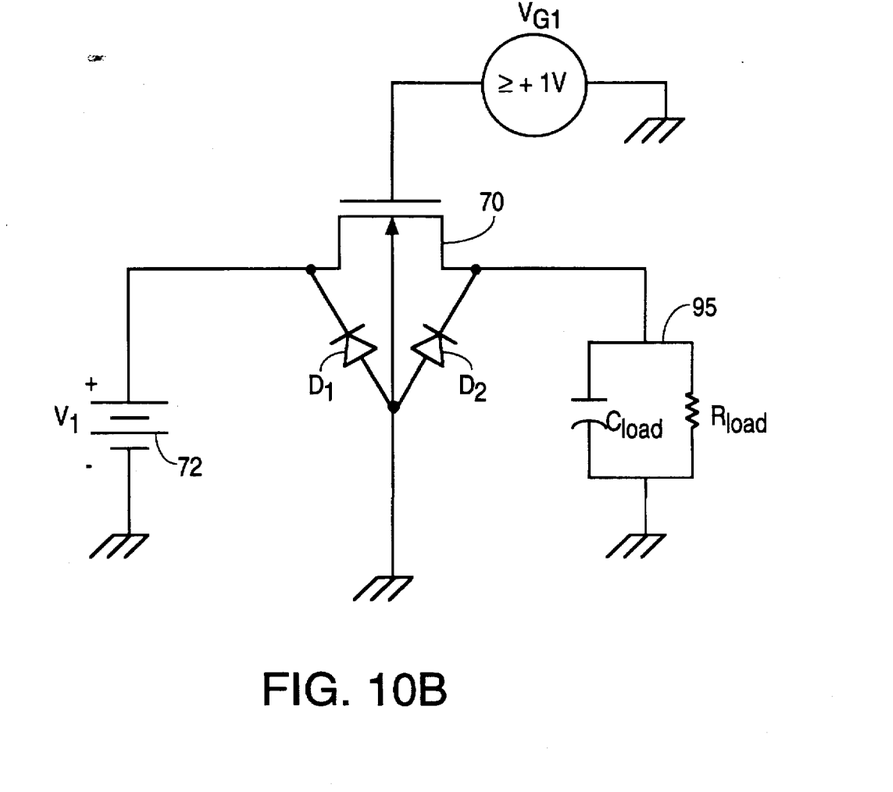

FIG. 10B illustrates the situation when the gate of switch 70 is biased at least one volt above ground. Switch 70 is then turned on, allowing battery 72 to supply a load 95, which includes a capacitance $C_{load}$ and resistance $R_{load}$.

Figure 11A:
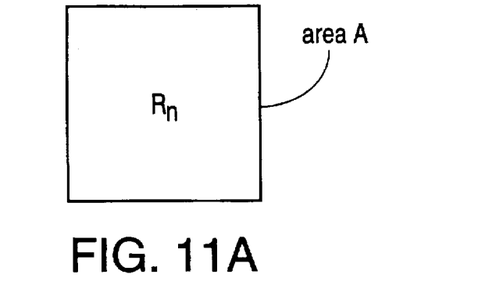
FIGS. 11A–11D illustrate conceptually the reduced on-resistance which is obtained using a bidirectional blocking switch in accordance with this invention.
Figure 11B:
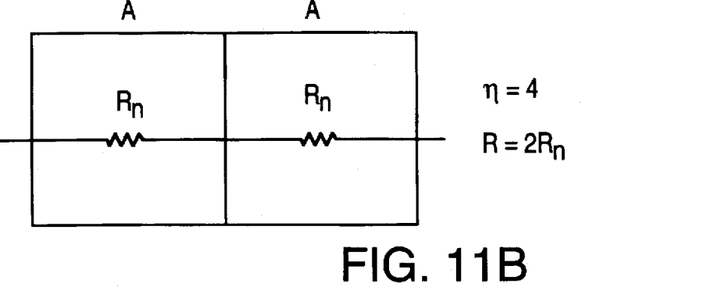

FIGS. 11A–11D illustrate a further advantage of bidirectional current blocking switches in accordance with this invention, namely, their significantly improved on-resistance. FIG. 11A shows an area A which represents the surface area of a lateral or vertical N-channel MOSFET. The on-resistance associated with the area A is designated $R_n$, which is typically 1 milliohm for each square cm in area A. A single P-channel device exhibits a resistance which is approximately 2.5 $R_n$ because of hole mobility which is poor relative to electron mobility. At voltages below about 20 V, the resistance per unit area is about the same whether the device is a vertical or lateral MOSFET. Even though the number of cells per unit area in a lateral MOSFET is nearly double that of a vertical DMOS, (because no area need be wasted on source-body shorts) half the cells in the lateral MOSFET are drain cells, whereas in the vertical DMOS the drain is on the bottom of the substrate.

Figure 11C:
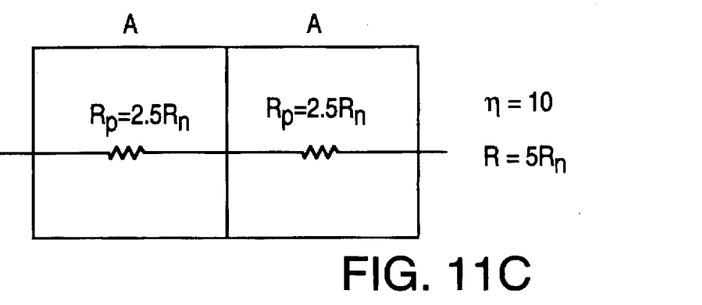

Returning to FIGS. 11A–11D, FIG. 11B represents the resistance of back-to-back N-channel DMOS devices, which occupy an area 2A. This resistance is shown as $2 R_n$ because the devices must be connected in series. As shown in FIG. 11C, for P-channel devices, the resistance of back-to-back devices is equal to about $5 R_n$.

Figure 11D:
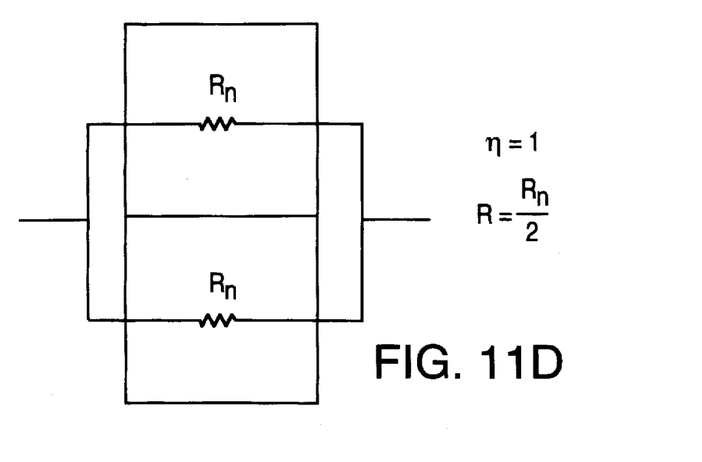

FIG. 11D illustrates that, because the device of this invention requires only a single MOSFET, the MOSFETS can be connected in parallel rather than in series. A pair of parallel N-channel MOSFETS has a resistance equal to $R_n/2$, which is only one-fourth the resistance of the back-to-back N-channel arrangement shown in FIG. 11B, and one-tenth the resistance of the back-to-back P-channel arrangement shown in FIG. 11C. Using the principles of this invention thus permits a dramatic reduction in the on-resistance, as compared with a back-to-back MOSFET arrangement. The resistance of the single N-channel MOSFET disconnect switch is assumed to be low because its gate drive is increased in relation to the voltage on its more negative terminal in order to maintain a constant channel resistance.

The foregoing examples are intended to be illustrative and not limiting. Many additional and alternative embodiments according to this invention will be apparent to those skilled in the art. All such embodiments are intended to be covered within the scope of this invention, as defined in the following claims.

I claim:

1. A method of blocking a flow of current between a first terminal and a second terminal, respective voltages at the first and second terminals varying such that during a first time interval a first voltage at the first terminal is greater than a first voltage at the second terminal and during a second time interval a second voltage at the second terminal is greater than a second voltage at the first terminal, the method comprising the steps of:

providing a MOSFET, the MOSFET comprising a first region of a first conductivity type separated from a second region of the first conductivity type by a body region of a second conductivity type, the MOSFET further comprising a gate separated from a channel region of the body region by a dielectric layer, wherein neither the first region nor the second region is shorted by the body region;

conducting said first terminal to said first region;

connecting said second terminal to said second region;

maintaining the body region at at least one potential such that neither a PN junction between the first region and the body region nor a PN junction between the second region and the body region is forward-biased so as to conduct a current as the voltages at the first and second terminals vary;

biasing the gate so as to block a flow of current between the first and second regions in a first direction during the first time interval; and biasing the gate so as to block a flow of current between the first and second regions in a second direction during the second interval.

2. The method of claim 1 comprising the further step of biasing the gate so as to allow a flow of current between the first and second regions in the first direction.

3. The method of claim 2 comprising the further step of biasing the gate so as to allow a flow of current between the first and second regions in the second direction.

4. The method of claim 3 wherein the method further comprises connecting the first region is to a first terminal and connecting the first terminal to a first power source.

5. The method of claim 4 wherein the method further comprises connecting the second region to a second terminal and connecting the second region to a second power source.

6. The method of claim 5 wherein the first power source comprises a battery.

7. The method of claim 6 wherein the second power source comprises an AC/DC converter.

8. The method of claim 5 wherein the first power source comprises a first battery and the second power source comprises a second battery.

9. The method of claim 5 comprising the further step of connecting the second terminal to a load.

10. The method of claim 9 wherein the step of biasing the gate so as to block a flow of current in the first direction is immediately followed by the step of biasing the gate so as to allow a flow of current the first direction, and wherein a transition time between the step of biasing the gate so as to block a flow of current in the first direction and biasing the gate so as to allow a flow of current the first direction is fast relative to a capacitive reaction time of the load.

11. The method of claim 5 comprising the further step of connecting the first terminal to a battery charger.

12. The method of claim 1 wherein the step of maintaining the body region at at least one potential comprises maintaining the body region at a constant potential.

13. The method of claim 12 wherein each of the first and second voltages at the first terminal and each of the first and second voltages at the second terminal is greater than or equal to the constant potential.

14. The method of claim 12 wherein the constant potential is ground.

15. The method of claim 14 wherein the steps of biasing the gate to block the flow of current in the first and second directions, respectively, comprise connecting the gate to ground.

* * * * *